United States Patent
Biris et al.

(10) Patent No.: US 8,017,892 B2
(45) Date of Patent: Sep. 13, 2011

(54) APPARATUS AND METHODS FOR SYNTHESIS OF LARGE SIZE BATCHES OF CARBON NANOSTRUCTURES

(75) Inventors: Alexandru Sorin Biris, Little Rock, AR (US); Alexandru Radu Biris, Cluj Napoca (RO); Dan Lupu, Cluj Napoca (RO); Jon Gardner Wilkes, Little Rock, AR (US); Dan Alexander Buzatu, Benton, AR (US); Dwight Wayne Miller, Whitehall, AR (US); Jerry A. Darsey, Little Rock, AR (US)

(73) Assignee: Board of Turstees of the University of Arkansas, Little Rock, AK (US)

( * ) Notice: Subject to any disclaimer, the term of this patent is extended or adjusted under 35 U.S.C. 154(b) by 619 days.

(21) Appl. No.: 12/217,978

(22) Filed: Jul. 10, 2008

(65) Prior Publication Data
US 2008/0274280 A1    Nov. 6, 2008

Related U.S. Application Data

(60) Division of application No. 11/228,023, filed on Sep. 15, 2005, now Pat. No. 7,473,873, which is a continuation-in-part of application No. 11/131,912, filed on May 18, 2005.

(60) Provisional application No. 60/571,999, filed on May 18, 2004, provisional application No. 60/611,018, filed on Sep. 17, 2004.

(51) Int. Cl.
*H05B 6/10* (2006.01)
*H01L 31/18* (2006.01)

(52) U.S. Cl. .................. 219/643; 977/700
(58) Field of Classification Search .......... 219/600–677; 977/700–838
See application file for complete search history.

(56) References Cited

U.S. PATENT DOCUMENTS

| | | | |
|---|---|---|---|
| 4,147,571 A | 4/1979 | Stringfellow et al. | |
| 5,695,567 A | 12/1997 | Kordina et al. | |
| 6,299,683 B1 | 10/2001 | Rupp et al. | |
| 6,605,266 B2 | 8/2003 | Nesper et al. | |
| 6,692,717 B1 | 2/2004 | Smalley et al. | |
| 6,780,766 B2 | 8/2004 | Basceri et al. | |
| 6,793,967 B1 | 9/2004 | Ata et al. | |
| 2002/0102353 A1 | 8/2002 | Mauthner et al. | |
| 2002/0127170 A1 | 9/2002 | Hong et al. | |
| 2003/0079689 A1* | 5/2003 | Sumakeris et al. | 118/725 |
| 2003/0109382 A1* | 6/2003 | Nakayama et al. | 502/336 |
| 2003/0133866 A1 | 7/2003 | Jurng et al. | |

(Continued)

OTHER PUBLICATIONS

Iijima, S., "Helical Microtubules of Graphitic Carbon," Nature, vol. 353, pp. 56-58 (1991).

(Continued)

*Primary Examiner* — Daniel L Robinson
(74) *Attorney, Agent, or Firm* — Morris, Manning & Martin, LLP; Tim Tingkang Xia, Esq.

(57) ABSTRACT

An apparatus and method for synthesizing nanostructures. In one embodiment, the apparatus includes a reactor having a reaction zone and a conductive susceptor positioned in the reaction zone. The method includes the steps of transporting a gas mixture having an aerosolized catalyst, a feedstock and a carrier gas into the reaction zone of the reactor, inductively heating the reaction zone, and regulating a flow rate of the gas mixture to allow the catalyst to spend a sufficient amount of time in the reaction zone for the growth of nanostructures.

12 Claims, 8 Drawing Sheets

U.S. PATENT DOCUMENTS

2005/0000437 A1    1/2005    Tombler, Jr. et al.

OTHER PUBLICATIONS

Ando, Y. et al., "Growing Carbon Nanotubes," Materials Today, vol. _, pp. 22-29 (2004).

Soneda, Y. et al., "Synthesis of High Quality Multi-Walled Carbon Nanotubes From the Decomposition of Acetylene on Iron-Group Metal Catalysts Supported on MgO," Carbon, vol. 40, pp. 965-969 (2002).

Couteau, E. et al., "CVD Synthesis of High-Purity Multiwalled Carbon Nanotubes Using CaCO3 Catalyst Support for Large-Scale Production," Chem. Phys. Letters., vol. 378, pp. 9-17 (2003).

Xu, J.M. et al., "Preparation of Mg1-xFexMoO4 Catalyst and It's Application to Grow MWNTs with High Efficiency," Diamond & Related Materials, vol. 13, pp. 1807-1811 (2004).

Li, Y. et al., "Mass Production of High-Quality Multi-Walled Carbon Nanotubes Bundles on a Ni/Mo/MgO Catalyst," Carbon, vol. 43, pp. 295-301 (2005).

Hata, K. et al., "Water-Assisted Highly Efficient Synthesis of Impurity-Free Single-Walled Carbon Nanotubes" Science, vol. 306, pp. 1362-1364 (2004).

Rebouillant, S. et al., "Carbon Fibers," Third Edition, Revised and Expanded (1998).

Gennett, T et al., "Laser Synthesis of Single-Walled Carbon Nanotube Utilizing High Temperature Induction Heating," Mat Res Soc Symp Proc, vol. 633, pp. A2.3.1-A2.3.6 (2001).

Schmitt, T.C., et al., "Analysis of effluent gases during the CCVD growth of multi-wall carbon nanotubes from acetylene," Carbon, 44 (10), p. 2032-2038 (2006).

Lupu, D. et al., "Carbon Nanostructures Produced by CCVD with Induction Heating," Carbon, vol. 42, pp. 503-507 (2004).

Okamoto, A. et al., "Control of Diameter Distribution of Single-Walled Carbon Nanotubes Using the Zeolite-CCVD Method at Atmospheric Pressure," Carbon, vol. 43, pp. 431-436 (2005).

Aldea, N. et al."A New X-Ray Line Profile Approximation Used for the Evaluation of the Global Nanostructure of Nickel Clusters," J. Opt. Adv. Mat., vol. 6, pp. 225-235 (2004).

Ruckenstein, E. et al., "Metal-Support Interactions in Catalysis, Sintering, and Redispersion," Edited by Scott A. Stevenson et al. (1987).

Zaikovskii, V. et al., "The Relationship Between the State of Active Species in a Ni/Al2O3 Catalyst and the Mechanism of Growth of Filamentous Carbon," Kinetics Catal, vol. 42, No. 6, pp. 813-820 (2001).

Liang, Q. et al., "Carbon Nanotube Growth on Ni-Particles Prepared in situ by Reduction of LaNiO4," Carbon, vol. 39, pp. 897-903 (2001).

Sato, S. et al., "Growth of Diameter-Controlled Carbon Nanotubes Using Monodispersed Nickel Nanoparticles Obtained with a Differential Mobility Analyzer," Chem. Phys. Letters, vol. 382, pp. 361-366 (2003).

Little, R.B., "Mechanistic Aspects of Carbon Nanotube Nucleation and Growth," J. Cluster Science, vol. 14, pp. 135-185 (2003).

Piao, L. et al., "Methane Decomposition to Carbon Nanotubes and Hydrogen on Alumina Supported Nickel Aerogel Catalyst," Catalysis Today, vol. 74, pp. 145-155, 2002.

Topasztó, L. et al., "Diameter and Morphology Dependence on Experimental Conditions of Carbon Nanotube Arrays Grown by Spray Pyrolysis," Carbon, vol. 43, pp. 970-977 (2005).

Magrez, A. et al., "Growth of Carbon Nanotubes With Alkaline Earth Carbonate as Support," J. Phys. Chem. vol. 109, pp. 10087-10091 (2005).

* cited by examiner

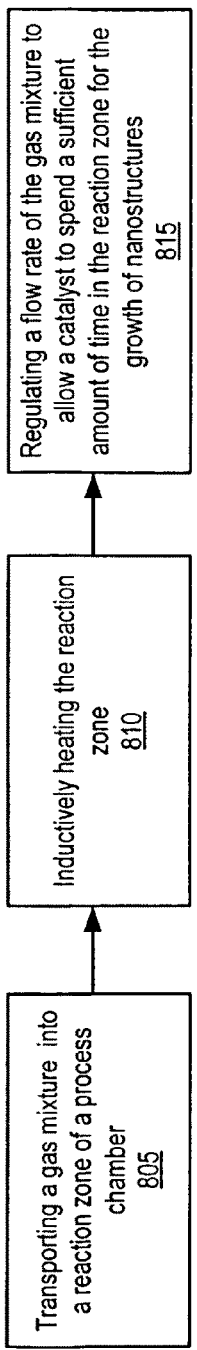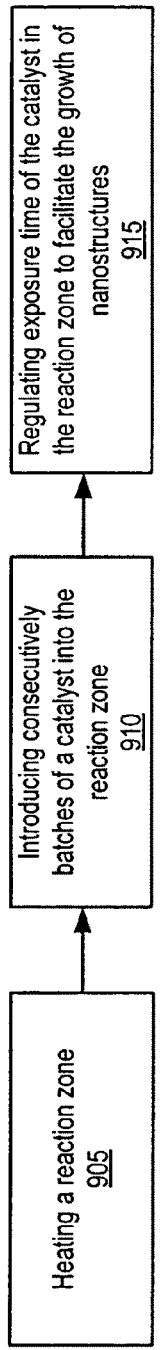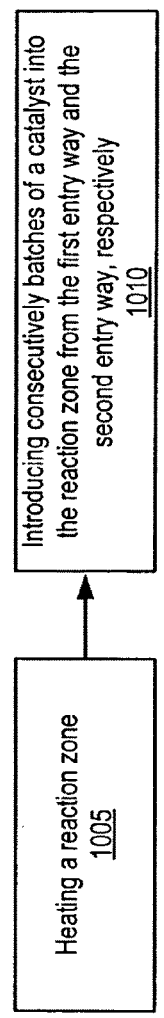

APPARATUS AND METHODS FOR SYNTHESIS OF LARGE SIZE BATCHES OF CARBON NANOSTRUCTURES

CROSS-REFERENCE TO RELATED PATENT APPLICATION

This application is a divisional application of, and claims benefit of U.S. patent application Ser. No. 11/228,023, filed Sep. 15, 2005, now U.S Pat. No. 7,473,873 entitled "Apparatus and Methods for Synthesis of Large Size Batches of Carbon Nanostructures," by Biris et al., which status is allowed, the disclosure of which is hereby incorporated herein in its entirety by reference.

This application is a continuation-in-part of U.S. patent application Ser. No. 11/131,912, filed May 18, 2005, entitled "APPARATUS AND METHODS OF MAKING NANOSTRUCTURES BY INDUCTIVE HEATING," by Alexandru Radu Biris, Dan Lupu, Alexandru Sorin Biris, Jon Gardner Wilkes, Dan Alexander Buzatu, Dwight Wayne Miller, and Jerry A. Darsey, the disclosure of which is hereby incorporated herein by reference in its entirety, which status is pending and itself claims the benefit, pursuant to 35 U.S.C. §119(e), of U.S. provisional patent application Ser. No. 60/571,999, filed May 18, 2004, entitled "APPARATUS AND METHODS OF HIGH THROUGHPUT GENERATION OF NANOSTRUCTURES BY INDUCTIVE HEATING AND IMPROVEMENTS INCREASING PRODUCTIVITY WHILE MAINTAINING QUALITY AND PURITY," by Alexandru Radu Biris, Dan Lupu, Alexandru Sorin Biris, Jon Gardner Wilkes, Dan Alexander Buzatu, Dwight Wayne Miller, and Jerry A. Darsey, which is incorporated herein by reference in its entirety. This application also claims the benefit, pursuant to 35 U.S.C. §119(e), of U.S. provisional patent application Ser. No. 60/611,018, filed Sep. 17, 2004, entitled "APPARATUS AND METHODS FOR SYNTHESIS OF LARGE SIZE BATCHES OF CARBON NANOSTRUCTURES," by Alexandru Sorin Biris, Dan Alexander Buzatu, Alexandru Radu Biris, Jon Gardner Wilkes, Dwight Wayne Miller, Jerry A. Darsey, and Dan Lupu, which is incorporated herein by reference in its entirety.

Some references, if any, which may include patents, patent applications and various publications, are cited and discussed in the description of this invention. The citation and/or discussion of such references is provided merely to clarify the description of the present invention and is not an admission that any such reference is "prior art" to the invention described herein. All references, if any, cited and discussed in this specification are incorporated herein by reference in their entireties and to the same extent as if each reference individually incorporated by reference.

FIELD OF THE INVENTION

The present invention is generally related to the field of production of nanostructures, and, more particularly, is related to apparatus and methods for synthesizing large size batches of carbon nanostructures.

BACKGROUND OF THE INVENTION

One of the most promising technologies for commercially producing carbon nanostructures such as single wall nanotubes, multi-wall nanotubes, nanofibers, and fullerenes is catalytic chemical vapor deposition (hereinafter "CCVD"). As illustrated in FIG. 1, in a CCVD type reactor, a hydrocarbon gas, or a hydrocarbon/carrier gas combination 10 is introduced into a reaction chamber 20 and passed over a susceptor 30 that contains a metal catalyst 40 heated to a specific temperature. The carrier gas can be nitrogen, argon, hydrogen, or helium. The reaction chamber 20 and the susceptor 30 are normally made from graphite, ceramic, or metal. The heating is achieved by using heating coils 70 wrapping around the reaction chamber 20. The metal catalyst 40 such as Fe, Co, or Ni, causes the hydrocarbon gas to decompose into its component carbon atoms, after which the carbon atoms recombine on the catalytic surface to form carbon nanostructures of various diameters and lengths. However, there are limitations with CCVD type reactor that limit the amount of nanostructures that can be produced at one time.

One of the major limitations of a conventional CCVD type reactor for nanostructure synthesis is the size of a susceptor that can be used. Large size susceptors, desirable for producing large quantities of carbon nanostructures, introduce difficulties in controlling the hydrocarbon gas flow over the catalyst powder bed and attaining tight control of a reaction temperature. It is known that when a hydrocarbon or a mixture of hydrocarbon and carrier gas, also called carbon feedstock or feedstock gas, moves horizontally along the susceptor 30, the catalyst 50 placed at the front end of the susceptor 30 is exposed to the carbon feedstock before the catalyst 60 at the end of the susceptor 30, usually depleting the carbon feedstock gas before it reaches the end of the susceptor 30. The catalyst 60 at the end of the susceptor 30 usually comes into contact with the feedstock gas when the nanostructures growing on the catalyst 50 at the front end of the susceptor 30 can no longer expand. Nanostructures grown in such reactors have large variations in lengths and diameters. Furthermore, the use of conventional ovens results in temperature gradient along the length of the oven. This temperature gradient results in varying temperature conditions that have a significant negative impact on the quality, characteristics, and purity of carbon nanostructures grown therein. Additionally, conventional ovens consume large amounts of energy and heat inefficiently. Because uniform length, diameter, and high purity are desired properties for carbon nanostructure, the performance of CCVD type reactor needs to be improved.

Therefore, a heretofore unaddressed need exists in the art to address the aforementioned deficiencies and inadequacies.

SUMMARY OF THE INVENTION

In one aspect, the present invention relates to an apparatus for synthesizing nanostructures. In one embodiment, the apparatus includes a chamber. The chamber has a first end, an opposite, second end, and a body portion defined therebetween, where the body portion defines a cavity therein and has an axis. The chamber further has a first opening channel interconnecting through the first end in fluid communication with the cavity, and a second opening channel interconnecting through the second end in fluid communication with the cavity. In one embodiment, the first opening channel is adapted for inputting a gas mixture, and the second opening channel is adapted for outputting an exhaust gas mixture, respectively. In one embodiment, the gas mixture flows from the first opening channel to the second opening channel of the chamber. The gas mixture includes at least one of a carrier gas and a feedstock gas. In one embodiment, the feedstock gas has hydrocarbon. The exhaust gas mixture has at least one of a carrier gas and an un-reacted feedstock gas. The chamber is made from graphite, quartz, metal, or a combination thereof.

Furthermore, the apparatus includes a heating member that is formed on the exterior surface of the body portion of the chamber for heating the chamber so as to create a reaction zone in the cavity. The heating member can be a thermal oven, an inductive oven, or a combination thereof.

Moreover, the apparatus includes a honeycomb-like structure having an axis and positioned in the reaction zone with the axis being substantially coincident with the axis of the cavity of the chamber, and a porous plate having an axis and positioned in the reaction zone and between the honeycomb-like structure and the second end of the chamber with the axis being substantially coincident with the axis of the cavity of the chamber. The honeycomb-like structure and the porous plate are adapted such that in use when a gas mixture passes through the porous plate, the gas mixture is substantially uniformly distributed over a catalyst supported by the porous plate so as to enhance interaction of the gas mixture with the catalyst. In one embodiment, the gas mixture after crossing the porous plate causes the catalyst to fluidize such that particles of the catalyst are suspended individually in the gas stream of the gas mixture.

Additionally, the apparatus includes a preheating member placed in the cavity of the chamber and between the first end of the chamber and the honeycomb-like structure. The apparatus also includes means for vibrating the apparatus so as to improve fluidization of the catalyst interacting with the gas mixture.

In another aspect, the present invention relates to a method for synthesizing nanostructures. In one embodiment, the method has the step of providing an apparatus. The apparatus includes a chamber that has a first end, an opposite, second end, a body portion defined therebetween and defining a cavity with an axis, a first opening channel interconnecting through the first end in fluid communication with the cavity, and a second opening channel interconnecting through the second end in fluid communication with the cavity. The apparatus further includes a heating member that is formed on the exterior surface of the body portion of the chamber for substantially uniformly heating the chamber so as to create a reaction zone in the cavity. Furthermore, the apparatus includes a honeycomb-like structure having an axis and positioned in the isothermal zone with the axis being substantially coincident with the axis of the cavity of the chamber, and a porous plate having an axis and positioned in the isothermal zone and between the honeycomb-like structure and the second end of the chamber with the axis being substantially coincident with the axis of the cavity of the chamber, where the porous plate is adapted for receiving and supporting a catalyst.

The method further has the steps of introducing a gas mixture through the first opening channel into the cavity of the chamber and generating nanostructures from the interaction of the gas mixture and the catalyst in the reaction zone. Furthermore, the method has the step of outputting an exhaust gas mixture out of the cavity from the second opening channel of the chamber. In one embodiment, the method also has the steps of preheating the gas mixture before the gas mixture reaches the catalyst, and vibrating the apparatus for improving fluidization of the catalyst interacting with the gas mixture.

In yet another aspect, the present invention relates to an apparatus for synthesizing nanostructures. In one embodiment, the apparatus has a chamber. The chamber has a first end, an opposite, second end, and a body portion defined therebetween, where the body portion defines a cavity therein with an axis. In one embodiment, the chamber further comprises a first opening channel interconnecting through the first end in fluid communication with the cavity, and a second opening channel interconnecting through the second end in fluid communication with the cavity. The first opening channel is adapted for a gas mixture to enter, and the second opening channel is adapted for an exhaust gas mixture to exit, respectively.

Moreover, the apparatus has a heating member formed on the exterior surface of the chamber for heating the chamber so as to create an reaction zone in the cavity. The heating member in one embodiment can be a thermal oven, an inductive oven, or a combination thereof. Furthermore, the apparatus has a porous plate having an axis and positioned in the isothermal zone with the axis being substantially coincident with the axis of the cavity of the chamber, and a susceptor having a body portion defining a recess therein, placed in the reaction zone and supported by the porous plate, the recess being at least partially filled with a catalyst. The porous plate and the susceptor are adapted such that when a gas mixture passes through the susceptor, the interaction of the gas mixture with the catalyst in the susceptor produces nanostructures. In one embodiment, the porous plate is made of metal mesh. The susceptor is made from graphite, ceramic, metal, or a combination thereof.

Additionally, the apparatus has a honeycomb-like structure placed between the first end of the chamber and the susceptor for improving uniform distribution of the gas mixture. The apparatus also has means for vibrating the apparatus so as to improve fluidization of the catalyst interacting with the gas mixture.

In a further aspect, the present invention relates to a method for synthesizing nanostructures. In one embodiment, the method comprises the step of providing an apparatus, where the apparatus has a chamber having a first end, an opposite, second end, and a body portion defined therebetween and defining a cavity with an axis, a heating member formed on the exterior surface of the chamber for heating the chamber so as to create a reaction zone in the cavity, a porous plate having an axis and positioned in the reaction zone with the axis being substantially coincident with the axis of the cavity of the chamber, and a susceptor having a body portion defining a recess therein, placed in the reaction zone and supported by the porous plate, where the recess is at least partially filled with a catalyst.

The method further comprises the steps of introducing a gas mixture through the first opening channel into the cavity of the chamber, generating nanostructures from the interaction of the gas mixture and the catalyst in the reaction zone, and collecting the generated nanostructures through the second end of the chamber when they are filled in and overflown from the susceptor. Additionally, the method comprises the step of vibrating the apparatus for improving fluidization of the catalyst interacting with the gas mixture.

In yet a further aspect, the present invention relates to an apparatus for synthesizing nanostructures. In one embodiment, the apparatus has a chamber having a first end, an opposite, second end, and a body portion defined therebetween, a heating member formed on the exterior surface of the body portion of the chamber defining a reaction zone inside the chamber, a conductive susceptor positioned in the reaction zone, and means for regulating a flow rate of a gas mixture containing an aerosolized catalyst and a feedstock to allow the catalyst to spend a sufficient amount of time in the reaction zone for the growth of nanostructures. In one embodiment, the gas mixture further comprises a carrier gas.

In one embodiment, the heating member has a conductive inductor in the form of inductor coils. The conductive inductor is electrically coupled to an AC power supply. In one embodiment, the conductive inductor is configured such that, in operation, it allows an alternating current to pass through to generate an electromagnetic field with a frequency at least in the reaction zone and induce current in the conductive susceptor so as to generate a heat flow from the conductive susceptor to the body portion of the chamber to allow nanostructures to be grown in the chamber.

The conductive susceptor is made of a substantially conductive material. In one embodiment, the conductive susceptor is made of a substantially conductive material that is chemically compatible to carbon and its compounds, where the substantially conductive material that is chemically compatible to carbon and its compounds comprises graphite.

The regulating means, in one embodiment, includes at least three gas regulators. Each gas regulator has a source associating with a corresponding one of an aerosolized catalyst, a feedstock gas and a carrier gas, a vale in communication with the source for controlling a flow rate of a gas from the source, and a flow meter in communication with the vale for monitoring the flow rate therethrough. The regulating means also includes a gas chamber that produces a gas mixture having the aerosolized catalyst, the feedstock gas, and the carrier gas output from the at least three gas regulators, and a pressure gauge in communication with the gas chamber for monitoring a pressure of the gas mixture transporting into the chamber.

Additionally, the apparatus comprises a pressure gauge positioned at the second end of the chamber for monitoring a pressure of the exhaust gas out of the chamber, and at least a gas output valve and a vacuum line coupled with the pressure gauge for outputting the exhaust gas.

In another aspect, the present invention relates to a method for synthesizing nanostructures in a reactor having a reaction zone and a conductive susceptor positioned in the reaction zone. In one embodiment, the method includes the steps of transporting a gas mixture having an aerosolized catalyst, a feedstock and a carrier gas into the reaction zone of the reactor, inductively heating the reaction zone, and regulating a flow rate of the gas mixture to allow the catalyst to spend a sufficient amount of time in the reaction zone for the growth of nanostructures. In one embodiment, the inductively heating step comprises the step of inducing current in the conductive susceptor so as to generate a heat flow from the conductive susceptor.

In one aspect, the present invention relates to an apparatus for synthesizing nanostructures. In one embodiment, the apparatus has a reactor having a reaction zone, and means for consecutively introducing batches of a catalyst to the reaction zone, where each batch of the catalyst is positioned in the reaction zone for a period of time for the growth of nanostructures.

In one embodiment, the reactor comprises a chamber having a first end, an opposite, second end, and a body portion defined therebetween, a trap door/valve and a gas inlet valve positioned at the first end of the chamber, wherein the trap door/valve and the gas inlet valve are configured such that when the trap door/valve is open, the gas inlet valve is close, and vice versa, a one-way gas exit valve positioned at the second end of the chamber for outputting an exhaust gas out of the reaction zone, and a heating member formed on the exterior surface of the body portion of the chamber defining the reaction zone of the reactor inside the chamber. The introducing means in one embodiment comprises a carousel type chuck. In one embodiment, the carousel type chuck includes a plurality of susceptor receptacles secured and arranged in a circular configuration within the chuck, and an arm engaged with the plurality of susceptor receptacles, where each susceptor receptacle has a supporting extension member and a corresponding susceptor for supporting a catalyst. In one embodiment, the supporting extension member is adapted for placing a batch of the catalyst supported by a corresponding susceptor in the reaction zone from the trap door/valve of the reactor for a period of time to facilitate the growth of nanostructures.

In operation, once the placing process of a susceptor receptacle is completed, a next susceptor receptacle is introduced into the reaction zone by rotating the carousel type chuck into a predetermined position, thereafter the arm is engaged to move the susceptor receptacle into the reaction zone. In one embodiment, the carousel type chuck operates in a pneumatic, hydraulic or electrical mechanism to rotate the carousel chuck and extend and retract the arm.

In another embodiment, the reactor comprises a first end portion and an opposite, second end portion defining a first entry way and a second entry way, respectively, a first airlock and a second airlock positioned at the first end portion and the second end portion, respectively, an inlet ball valve positioned between the reaction zone and the second airlock for sealing the airlock, a first input port and a first output port positioned between the first airlock and the reaction zone for inputting and outputting a carrier gas, respectively, a second input port and a second output port positioned between the inlet ball valve and the second airlock for inputting and outputting a gas mixture of a carrier gas and a feedstock gas, respectively, and a heating member formed on the reactor for heating the reaction zone. In one embodiment, the introducing means has a first set of susceptor receptacles and a second set of susceptor receptacles, where each susceptor receptacle is adapted for containing a batch of a catalyst. In one embodiment, the first set of susceptor receptacles and the second set of susceptor receptacles are introduced into the reaction zone of the reactor from the first entry way and the second entry way of the reactor, respectively.

In operation, once the introducing process of one of the first set of susceptor receptacle is completed, one of the second set of susceptor receptacle is introduced into the reaction zone of the reactor, and vice versa. In one embodiment, the first airlock and the second airlock are adapted for maintaining a flow rate of the carrier gas and the feedstock gas inside the reactor zone during the insertion or removal of susceptor receptacles.

In another aspect, the present invention relates to a method for synthesizing nanostructures in a reactor having a reaction zone. In one embodiment, the method includes the steps of heating the reaction zone, introducing consecutively batches of a catalyst into the reaction zone, and regulating exposure time of the catalyst in the reaction zone 508 to facilitate the growth of nanostructures.

In yet another aspect, the present invention relates to a method for synthesizing nanostructures in a reactor having a first entry way and an opposite, second entry way defining a reaction zone therebetween. In one embodiment, a method includes the steps of heating the reaction zone, and introducing consecutively batches of a catalyst into the reaction zone from the first entry way and the second entry way, respectively. In one embodiment, the method further includes the step of regulating exposure time of the catalyst in the reaction zone to facilitate the growth of nanostructures.

In a further aspect, the present invention relates to an apparatus for synthesizing nanostructures. In one embodiment, the apparatus has a chamber having a first end, an opposite, second end, and a body portion defined therebetween, the body portion having an interior surface and an opposite, exterior surface, a heating member formed on the exterior surface of the body portion of the chamber defining a reaction zone inside the chamber, a plurality of baffles protruding inwardly from the interior surface of the body portion of the chamber in the reaction zone, a catalyst tank positioned proximate to the first end of the chamber for introducing batches of catalyst in a powder form to the reaction zone, and an input valve positioned at the first end of the chamber for introducing a feedstock gas and a carrier gas to the reaction zone. When a stream of catalyst powder is introduced into the reaction zone, the stream of catalyst powder is deposited upon and sifted between the pluralities of baffles to facilitate the growth of nanostructures. In one embodiment, the baffles are configured in a staggered descending vertical arrangement, wherein each consecutive baffle is located on a side that is opposite to that of its predecessor. Each of the baffles further comprises a downward sloping shape for allowing for any material that is deposited upon a baffle to be easily transferred to a lower level baffle.

Moreover, the apparatus has a catalyst feeder in communication with the catalyst tank, wherein the catalyst feeder regulates the introduction of the stream of catalyst powder into the reaction zone. The apparatus further has a collector in communication with the second end of the chamber for collecting nanostructures. The apparatus also has means for outputting an exhaust gas mixture out of the reactor.

Additionally, the apparatus has means for vibrating the reactor so as to transfer the catalyst powder from one baffle to another baffle through the reaction zone. In one embodiment, the vibrating means vibrates along with gravity so as to provide the force that is needed to sift the catalyst powder from one baffle to another baffle through the reaction zone.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein:

FIG. 8 shows a flow diagram illustrating a method that relates to embodiments of the present invention.

FIG. 9 shows a flow diagram illustrating a method that relates to embodiments of the present invention.

FIG. 10 shows a flow diagram illustrating a method that relates to embodiments of the present invention.

DETAILED DESCRIPTION OF THE INVENTION

Figure 1:
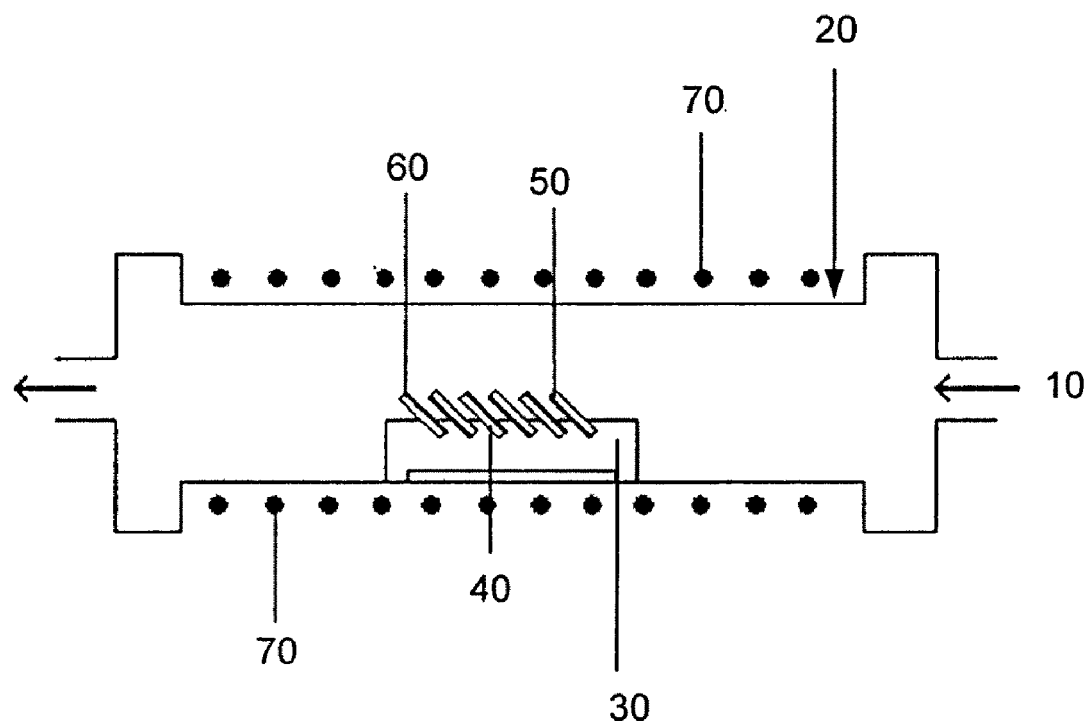
FIG. 1 shows schematically a catalytic chemical vapor deposition type reactor.

The present invention is more particularly described in the following examples that are intended as illustrative only since numerous modifications and variations therein will be apparent to those skilled in the art. Various embodiments of the invention are now described in detail. Referring to the drawings FIGS. 1-10, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

DEFINITIONS

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "carbon nanostructures" refer to carbon fibers or carbon nanotubes that have a diameter of 1 μm or smaller which is finer than that of carbon fibers. However, there is no particularly definite boundary between carbon fibers and carbon nanotubes. By a narrow definition, the material whose carbon faces with hexagon meshes are almost parallel to the axis of the corresponding carbon tube is called a carbon nanotube, and even a variant of the carbon nanotube, around which amorphous carbon exists, is included in the carbon nanotube.

As used herein, "catalytic chemical vapor deposition method" or "CCVD" refers to a method in the art to synthesize fullerenes and carbon nanotubes by using acetylene gas, methane gas, or the like that contains carbon as a raw material, and generating carbon nanotubes in chemical decomposition reaction of the raw material gas. Among other things, the chemical vapor deposition depends on chemical reaction occurring in the thermal decomposition process of the methane gas and the like serving as the raw material, thereby enabling the manufacture of carbon nanotubes having high purity.

As used herein, "reaction zone" refers to a three-dimensional zone inside a nanostructure reactor where hydrocarbon molecules are heated to produce carbon molecules.

As used herein, "isothermal zone" refers to a reaction zone where the temperature is substantially the same.

DESCRIPTION OF THE PREFERRED EMBODIMENTS

Nanostructure reactors that implement CCVD methods to produce carbon nanostructures require that hydrocarbon molecules be deposited on a heated catalyst material. Catalysts are typically used to disassociate the hydrocarbon molecules. Using hydrocarbons as a carbon source, the hydrocarbons flow into a reaction zone of a nanostructure reactor, where the hydrocarbons are heated at a high temperature. The dissociation of the hydrocarbon breaks the hydrogen bond, thus producing pure carbon molecules. The important parameters that influence the growth of carbon nanostructures are the nature and support of the catalyst, the hydrocarbon source and concentration, flow rate and type of carrier gas, time of reaction, temperature of reaction and the thermal stability in the reaction zone.

The present invention relates to apparatus and methods for synthesizing high quality and purity nanostructures with large quantities by, among other things, distributing a feedstock gas over a catalyst in a number of ways and improving the interaction of the feedstock gas with the catalyst.

Without intent to limit the scope of the invention, various embodiments of the present invention are described below.

Figure 2:
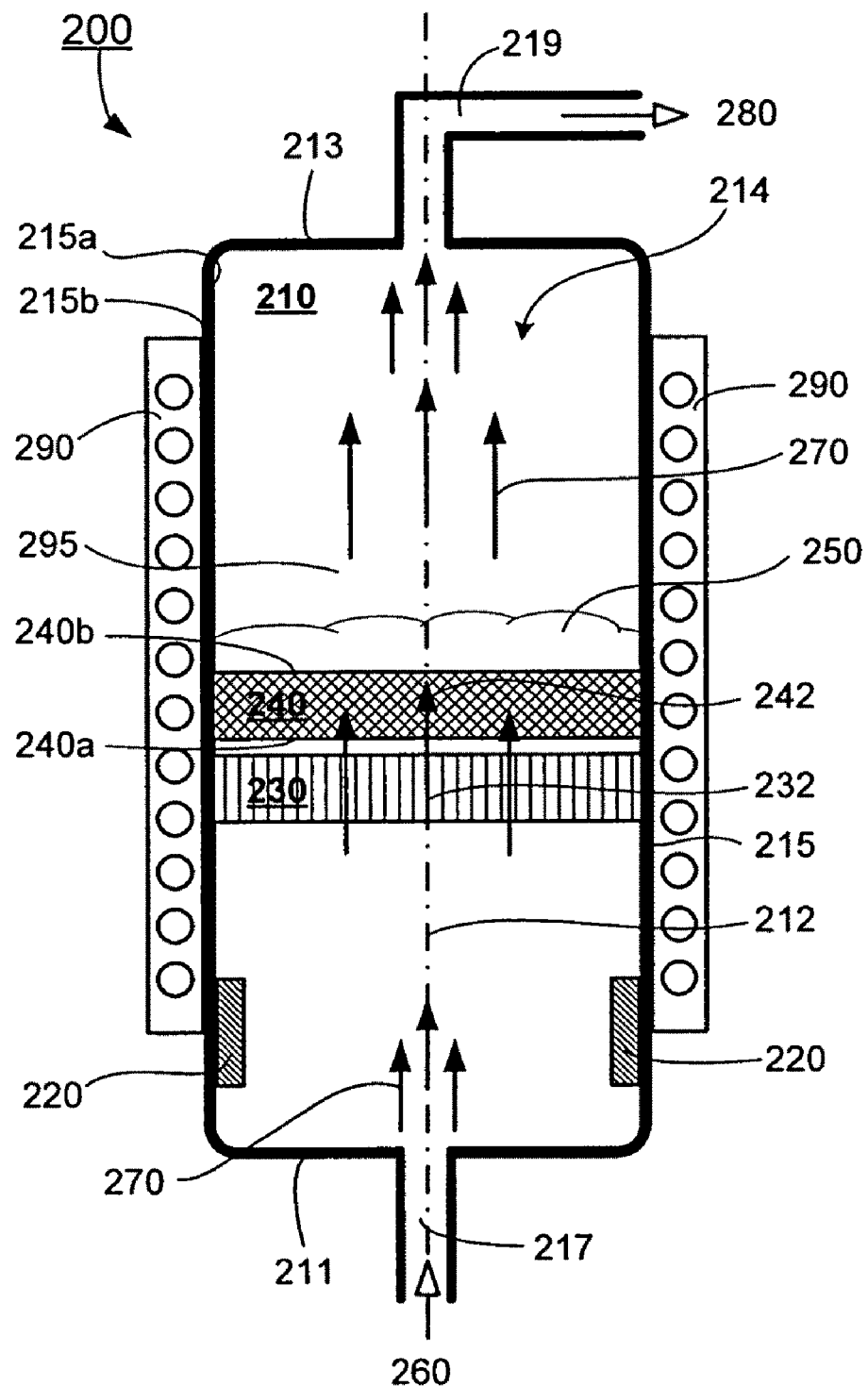
FIG. 2 shows schematically an apparatus for synthesizing nanostructures according to one embodiment of the present invention.

Referring to FIG. 2, an apparatus 200 for synthesizing nanostructures is shown according to one embodiment of the present invention. In this embodiment, the apparatus 200 includes a chamber 210, a heating member 290 for heating the chamber 210 and defining a reaction zone 295 therein, a porous plate 240 placed in the reaction zone 295 for supporting a catalyst 250, a honeycomb-like structure 230 placed next to the porous plate 240 for ensuring a substantially uniform distribution of a gas mixture over the porous plate 240. More specifically, the chamber 210 has a first end 211, an opposite, second end 213, and a body portion 215 defined therebetween, where the body portion 215 has an interior surface 215a defining a cavity 214 therein, an exterior surface 215b and an axis 212 through the cavity 214. The chamber 210 also has a first opening channel 217 interconnecting through the first end 211 in fluid communication with the cavity 214, and a second opening channel 219 interconnecting through the second end 213 in fluid communication with the cavity 214. The first opening channel 217 is adapted for introducing a gas mixture 260 to the cavity 214, and the second opening channel 219 is adapted for outputting an exhaust gas mixture 280 out of the cavity 214, respectively. In one embodiment, the first opening channel 217 and the second opening channel 219 are formed in the form of an inlet tube and an outlet tube that are protruded outwardly along the axis 212 of the cavity 214 from the first end 311 and the second end 213 of the chamber 210, respectively. The chamber 210 in one embodiment is made from graphite. It can also be made from quartz, metal, or a combination thereof.

The gas mixture 260 includes at least one of a carrier gas and a feedstock gas. In one embodiment, the feedstock gas has hydrocarbon. The gas mixture 260 flows from the first opening channel 217 to the second opening channel 219 of the chamber 210 in a direction 270, which may be or may not be against gravity. In the exemplary embodiment shown in FIG. 2, the flowing direction 270 of the gas mixture 260 is opposite to the direction of gravity. The exhaust gas mixture 280 has at least one of a carrier gas and an un-reacted feedstock gas and exits through the second opening channel 219 of the chamber 210.

The heating member 290 can be a thermal oven, an inductive oven, or a combination thereof. In one embodiment, the heating member 290 is an inductive oven containing a number of inductive coils, which is formed on the exterior surface 215b of the body portion 215 of the chamber 210 for heating the chamber 210 thereby creating a substantially isothermal zone 295 in the cavity 214 to ensure a stable, specific temperature required for the catalytic chemical vapor decomposition of hydrocarbons.

The porous plate 240 has a first surface 240a, an opposite, second surface 240b, and an axis 242 and is positioned in the reaction zone 295 in the cavity 214 with the axis 242 being substantially coincident with the axis 212 of the cavity 214 of the chamber 210. The catalyst 150 is deposited on and supported by the second surface 240b of the porous plate 240. The honeycomb-like structure 230 has an axis 232 and is positioned between the first surface 240a of the porous plate 240 and the second end 213 of the chamber 210 with the axis 232 being substantially coincident with the axis 212 of the cavity 214 of the chamber 210. The honeycomb-like structure 230 and the porous plate 240 are adapted such that in use when the gas mixture 260 passes through the honeycomb-like structure 230 and the porous plate 240, the gas mixture 260 is substantially uniformly distributed over the catalyst 250 that is supported by the porous plate 240, thereby enhancing interaction of the gas mixture 260 with the catalyst 250. Carbon nanostructures are generated through the interaction of the gas mixture 260 and the catalyst 250. In one embodiment, the gas mixture 260 after crossing the porous plate 240 causes the catalyst 250 to fluidize such that particles of the catalyst 250 are suspended individually in the gas stream of the gas mixture 260. The apparatus 200 can therefore be referred to as a fluidizing bed-type reactor. The fluidization process is essential for a substantial uniform distribution of the feedstock and improves the overall control of the length, diameter and purity of the resulting carbon nanostructures.

Additionally, the apparatus 200 includes means for vibrating the apparatus 200 so as to improve fluidization of the catalyst interacting with the gas mixture 260.

To further enhance the interaction of the gas mixture 260 with the catalyst 250, the gas mixture 260 may be pre-heated before it enters the chamber 210 of the apparatus 200. Alternatively, the gas mixture 260 may be pre-heated after it enters the chamber 210 with a preheating member 220 that is placed in the cavity 215 of the chamber 210 and between the first end 211 of the chamber 210 and the honeycomb-like structure 230.

The combination of the honeycomb structure 230, the porous plate 240, and the fluidizing stream in the fluidizing bed-type apparatus 200 is used to produce high quality and purity nanostructures with large quantities. The superior performance of the fluidizing bed-type apparatus 200 is achieved through an improved, substantial uniform feedstock gas distribution and an enhanced interaction of the feedstock gas with the catalyst particle 250.

The present invention in one aspect relates to a method for synthesizing nanostructures using the apparatus 200 as disclosed above. In practice, gas mixture 260 introduced through the first opening channel 217 into the cavity 214 of the chamber 210, nanostructures are generated from the interaction of the gas mixture 260 and the catalyst 250 in the reaction zone 295, and the exhaust gas mixture is outputted out of the cavity 214 through the second opening channel 219 of the chamber 210.

Figure 3:
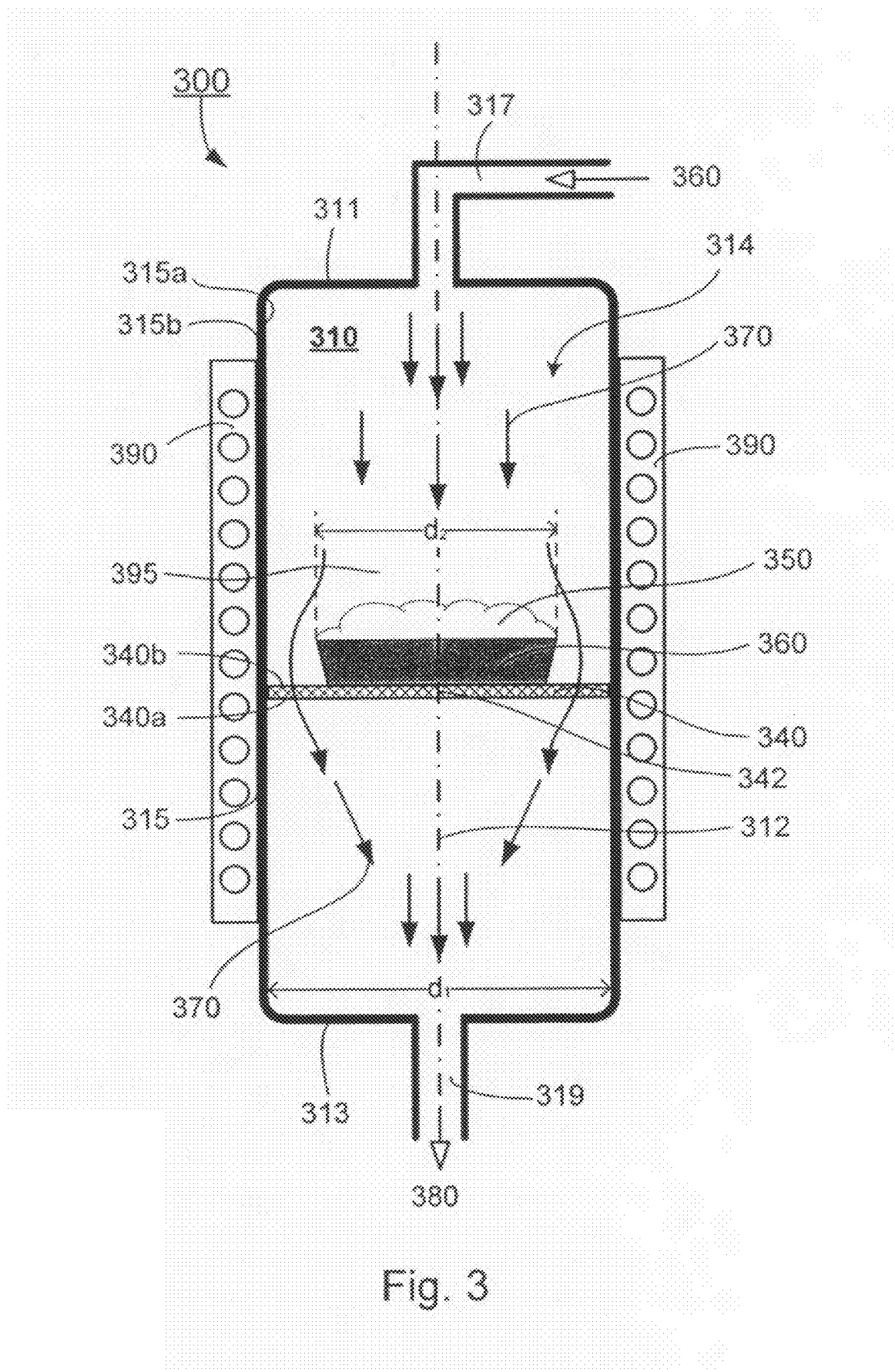
FIG. 3 shows schematically an apparatus for synthesizing nanostructures according to another embodiment of the present invention.

Referring to FIG. 3, an apparatus 300 for synthesizing nanostructures is shown according another embodiment of the present invention. The apparatus 300 has a chamber 310, a heating member 390 formed on the exterior surface 315b of the chamber 310 and defining a reaction zone 395 inside the chamber 310, a susceptor 360 positioned in the reaction zone 395 and filled with a catalyst 350, and a porous plate 340 positioned the reaction zone 395 for supporting the susceptor 360. In the embodiment, the chamber 310 has a first end 311, an opposite, second end 313, and a body portion 315 defined therebetween, where the body portion 315 defines a cavity 314 with an axis 312 and a diameter, $d_1$. The chamber 310 further has a first opening channel 317 interconnecting through the first end 311 in fluid communication with the cavity 314, and a second opening channel 319 interconnecting through the second end 313 in fluid communication with the cavity 314. The first opening channel 317 is adapted for introducing a gas mixture 360 to the cavity 314. The second opening channel 319 is adapted for outputting an exhaust gas mixture 380 out of the cavity 314. In one embodiment, the first opening channel 317 and the second opening channel 319 are formed in the form of an inlet tube and an outlet tube that are protruded outwardly along the axis 312 of the cavity 314 from the first end 311 and the second end 313 of the chamber 310, respectively. The chamber 310 in one embodiment is made from graphite. It can also be made from quartz, metal, or a combination thereof.

The gas mixture 360 includes at least one of a carrier gas and a feedstock gas. In one embodiment, the feedstock gas has hydrocarbon. The gas mixture 360 flows from the first opening channel 317 to the second opening channel 319 of the chamber 310 in a direction 370. In the embodiment shown in FIG. 3, the direction 370 is coincident with the direction of gravity. The exhaust gas mixture 380 has at least one of a carrier gas and an un-reacted feedstock gas and exits through the second opening channel 319 of the chamber 310.

The heating member 390 can be a thermal oven, an inductive oven, or a combination thereof. In one embodiment, the heating member 390 is an inductive oven containing a number of inductive coils, which formed on the exterior surface 315b of the chamber 310 for heating the chamber 310 thereby creating a substantially isothermal zone 395 in the cavity 314. The temperature in the isothermal zone 395 is substantially uniformly distributed.

The porous plate 340 has an axis 342 and is positioned in the reaction zone 395 with the axis 342 being substantially coincident with the axis 312 of the cavity 314 of the chamber 310. The susceptor 360 has a body portion defining a recess therein and is placed in the reaction zone 395 and supported by the porous plate 340. The recess is at least partially filled with the catalyst 350. The porous plate 340 and the susceptor 360 are adapted such that when the gas mixture 360 passes through the susceptor 360, the interaction of the gas mixture 360 with the catalyst 350 in the susceptor 360 produces nanostructures and causes the susceptor 360 to fill and overflow with the produced nanostructures, which then are collectable through the second end 313 of the chamber 310. In one embodiment shown in FIG. 3, the susceptor 360 is sized with a diameter, $d_2$, which is less than the diameter $d_1$ of the cavity 314 of the chamber 310 such that when the susceptor 360 is placed on the porous plate 340, there is a space formed between an edge of the susceptor 360 and the interior surface 315a of the chamber 310, which allows the produced nanostructures overflown from the susceptor 360 and the exhaust mixture gas to pass through. In one embodiment, the porous plate 340 is made of metal mesh. The susceptor 360 is made from graphite, ceramic, metal, or a combination thereof.

Additionally, the apparatus 300 may have a honeycomb-like structure placed between the first end 311 of the chamber 310 and the susceptor 360 for improving uniform distribution of the gas mixture. The apparatus 300 may also have means for vibrating the apparatus 300 so as to improve fluidization of the catalyst interacting with the gas mixture 360. The reactor 300 can be referred to as an impaction-type reactor.

In operation, the gas mixture 360 is introduced through the first opening channel 317 into the cavity 314 of the chamber 310. The introduced gas mixture 360 interacts with the catalyst 350 in the susceptor 360 placed in the isotheromal zone 395 that is heated at a predetermined temperature, hereby generating nanostructures in the susceptor 360. As the interaction time evolves, the generated nanostructures fill in and overflow from the susceptor 360. The generated nanostructures overflown from the susceptor 360 are then collected through the second end 313 of the chamber 310.

Figure 4:
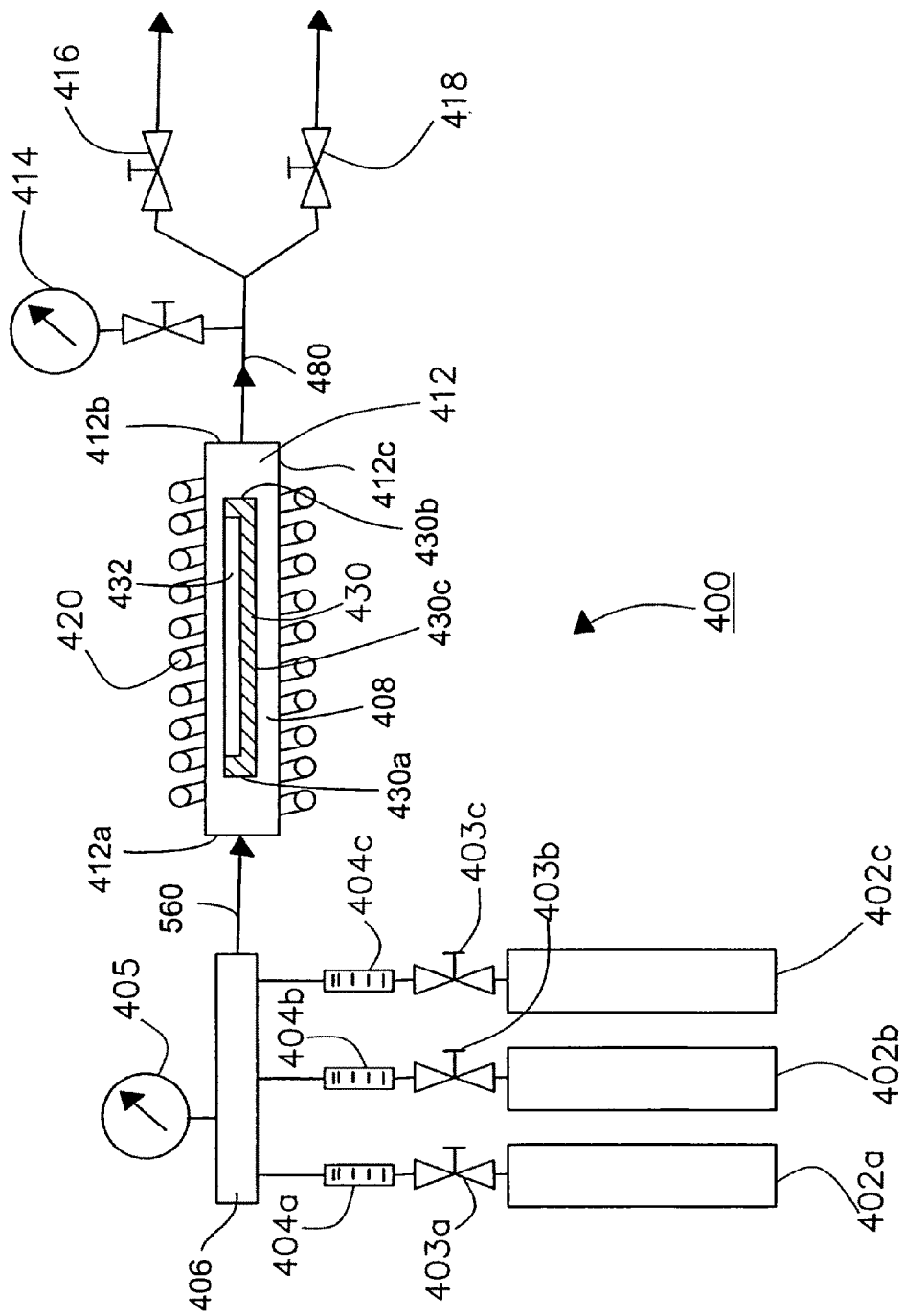
FIG. 4 shows schematically an apparatus for synthesizing nanostructures according to yet another embodiment of the present invention.

Referring to FIG. 4, an apparatus 400 for synthesizing nanostructures is shown according to one embodiment of the present invention. In this embodiment, the apparatus 400 has a chamber 412, a heating member 420 formed on the exterior surface of the chamber 412 defining a reaction zone 408 that is located within the confines of the chamber 412, a conductive susceptor 430 placed in the reaction zone 408, and means for regulating a flow rate of a gas mixture 460 containing an aerosolized catalyst 402a and a feedstock 402b to allow the catalyst to spend a sufficient amount of time in the reaction zone 408 for the growth of nanostructures having specific dimensions, number of walls, and other desired features.

As shown in FIG. 4, the chamber 412 has a first end 412a, an opposite, second end 412b, and a body portion 412c defined therebetween. The chamber 412 in one embodiment is in the form of a tube and is made of quartz. The conductive susceptor 430 has a first end 430a and an opposite, second surface 430b defining a body portion 430c therebetween. The body portion 430c defines a recess 432 therein. A catalyst (not shown) is situated upon the conductive susceptor 430. The conductive susceptor 430 can be made of a substantially conductive material. In one embodiment, the conductive susceptor 430 is made of a substantially conductive material that is chemically compatible to carbon and its compounds, which means this material does not significantly affect or interfere with chemical properties of the carbon-based nanostructures. One substantially conductive material that is chemically compatible to carbon and its compounds is graphite, which has been used as a preferred material for the conductive susceptor 430. Alternatively, the substantially conductive material comprises at least one of metals, alloys, and ferromagnetic materials. For examples, titanium, stainless steel, iron, molybdenum, and any of their combinations can be used to practice the present invention.

In one embodiment, the heating member 420 has a conductive inductor in the form of inductor coils 420. The conductive inductor is electrically coupled to an AC power supply (not shown). In one embodiment, the conductive inductor is configured such that, in operation, it allows an alternating current to pass through to generate an electromagnetic field with a frequency at least in the reaction zone 408 and induce current in the conductive susceptor 430 so as to generate a heat flow from the conductive susceptor 430 to the body portion 412c of the chamber 412 to allow nanostructures to be grown in the chamber 412. The thermal gradient from the conductive susceptor 430 is transferred to the catalyst, therefore greatly increasing the efficiency of heat transfer to the catalyst. Note that the conductive susceptor 430 may comprise an appropriate material on which the catalyst may be deposited. Further, the surface of the conductive susceptor 430 should allow for superior adherence between the catalyst and the conductive susceptor 430 in addition to providing an appropriate thermal contact for the catalyst.

Furthermore, the apparatus 400 has means for regulating a flow rate of the gas mixture 460 containing an aerosolized catalyst 402a and a feedstock 402b to allow the catalyst to spend the sufficient amount of time in the reaction zone 408 for the growth of nanostructures having specific dimensions, number of walls, and other desired features. In one embodiment, the gas mixture 460 also contains a carrier gas 402c. The regulating means, in one embodiment, includes at least three gas regulators. Each gas regulator has a source 402a, 402b or 402c associating with a corresponding one of an aerosolized catalyst 402a, a feedstock gas 402b and a carrier gas 402c, a vale 403a, 403b or 403c in communication with the source for controlling a flow rate of a gas from the source, and a flow meter 404a, 404b or 404c in communication with the vale for monitoring the flow rate therethrough. The regulating means also includes a gas chamber 406 that produces the gas mixture 460 that includes the aerosolized catalyst 402a, the feedstock gas 402b, and the carrier gas 402c output from the at least three gas regulators, and a pressure gauge 405 in communication with the gas chamber 406 for monitoring a pressure of the gas mixture 460 transporting into the chamber 412 from the first end 412a of the chamber 412.

Additionally, the apparatus 400 includes a pressure gauge 414 positioned at the second end 412b of the chamber 412 for monitoring a pressure of the exhaust gas 480 out of the chamber 412, and at least a gas output valve 416 and a vacuum line 418 coupled with the pressure gauge 414 for outputting the exhaust gas 480.

One of embodiments of the present invention relates to a method for the production of nanostructures in the chamber 412 having a reaction zone 408 and a conductive susceptor positioned in the reaction zone 408. Referring in general to FIGS. 8 and 4, the method includes the following steps: At step 805 a gas mixture 460 having an aerosolized catalyst 402a, a feedstock 402b and a carrier gas 402c is transported into the reaction zone 408 of the reactor 400, inductively heating the reaction zone 408. At step 810, the reaction zone 408 is inductively heated by the heating member 420 including inductive coils 210. At step 815, a flow rate of the gas mixture is regulated to allow the catalyst to spend a sufficient amount of time in the reaction zone 408 for the growth of nanostructures. In one embodiment, the inductively heating step (step 810) comprises the step of inducing current in the conductive susceptor so as to generate a heat flow from the conductive susceptor. The regulation of the flow rates of the carrier gas 402c, aerosolized catalyst 402a and carbon feedstock 402b is performed with flow-meters 404a, 404b and 404c, respectively. In additional embodiments other predetermined elemental feedstocks may be substituted for the carbon feedstock.

Figure 5:
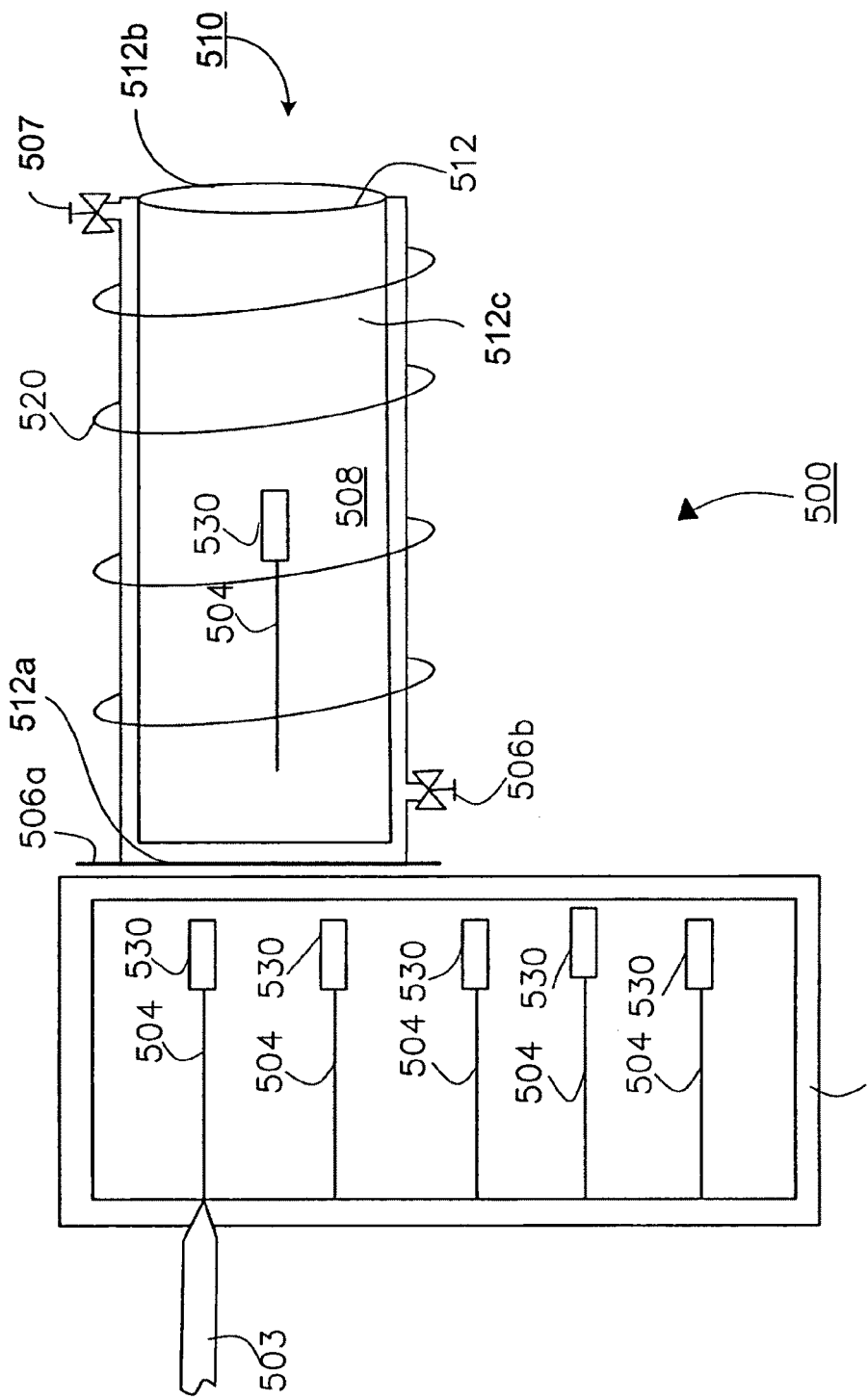
FIG. 5 shows schematically an apparatus for synthesizing nanostructures according to an alternative embodiment of the present invention.

FIG. 5 illustrates an apparatus 500 for synthesizing nanostructures according to another embodiment of the present invention. In this embodiment, the apparatus 500 has a reactor 510 having a reaction zone 508, and means for consecutively introducing batches of a catalyst to the reaction zone 508, where each batch of the catalyst is positioned in the reaction zone 508 for a period of time for the growth of nanostructures.

In one embodiment, the reactor 510 has a chamber 512 having a first end 512a, an opposite, second end 512b, and a body portion 512c defined therebetween. The chamber 512 is in the form of a tube and is made of quartz. The reactor 510 also has a trap door/valve 506a and a gas inlet valve 506b positioned at the first end 512a of the chamber 512, where the trap door/valve 506a and the gas inlet valve 506b are configured such that when the trap door/valve 506a is open, the gas inlet valve 506b is close, and vice versa. The trap door/valve 506a functions to keep air out of the reaction zone 508 in addition to keeping hydrocarbon feedstock out of the carousel chuck 502. Furthermore, the reactor 510 has a one-way gas exit valve 507 positioned at the second end 512b of the chamber 512 for outputting an exhaust gas out of the reaction zone 508, and a heating member 520 formed on the exterior surface of the body portion of the chamber 512 defining the reaction zone 508 of the reactor 500. The introducing means in one embodiment includes a carousel type chuck 502. The carousel type chuck 502 includes a plurality of susceptor receptacles secured and arranged in a circular configuration within the chuck 502, and an arm 503 engaged with the plurality of susceptor receptacles. Each susceptor receptacle includes a supporting extension member 504 and a corresponding susceptor 530 for supporting a catalyst. In one embodiment, the supporting extension member 504 is adapted for placing a batch of the catalyst supported by a corresponding susceptor 530 in the reaction zone 508 from the trap door/valve 506a of the reactor 500 for a period of time to facilitate the growth of nanostructures.

Once a respective receptacle inserting process is completed, another susceptor receptacle is introduced into the reaction zone 508 by rotating the carousel chuck 502 into a predetermined position, thereafter the arm 503 is engaged to move the catalyst 530 into the reaction zone 508. This aspect of the present invention may be accomplished using a pneumatic, hydraulic or electrical device (not shown) to rotate the carousel chuck 502 and extend and retract the arm 503. This process enables increased production of nanostructures while still maintaining high quality and purity of the resultant products.

In one aspect, the present invention relates to a method synthesizing nanostructures in the apparatus 500 that includes a reactor 512 having a reaction zone 508. FIG. 9 shows a flow chart of the method comprising the following steps: at step 905, the reaction zone 508 of the nanostructure reactor 512 is heated. At step 910, batches of a catalyst are consecutively introduced into the reaction zone 508 from the first end 512a of the nanostructure reactor 512. At step 915, the exposure time of the catalyst in the reaction zone 508 is regulated to facilitate the growth of nanostructures having desired features. In one embodiment, the heating step is performed with a thermal oven or an inductive oven, and the introducing step is preformed using a carousel shaped chuck 502.

Figure 6:
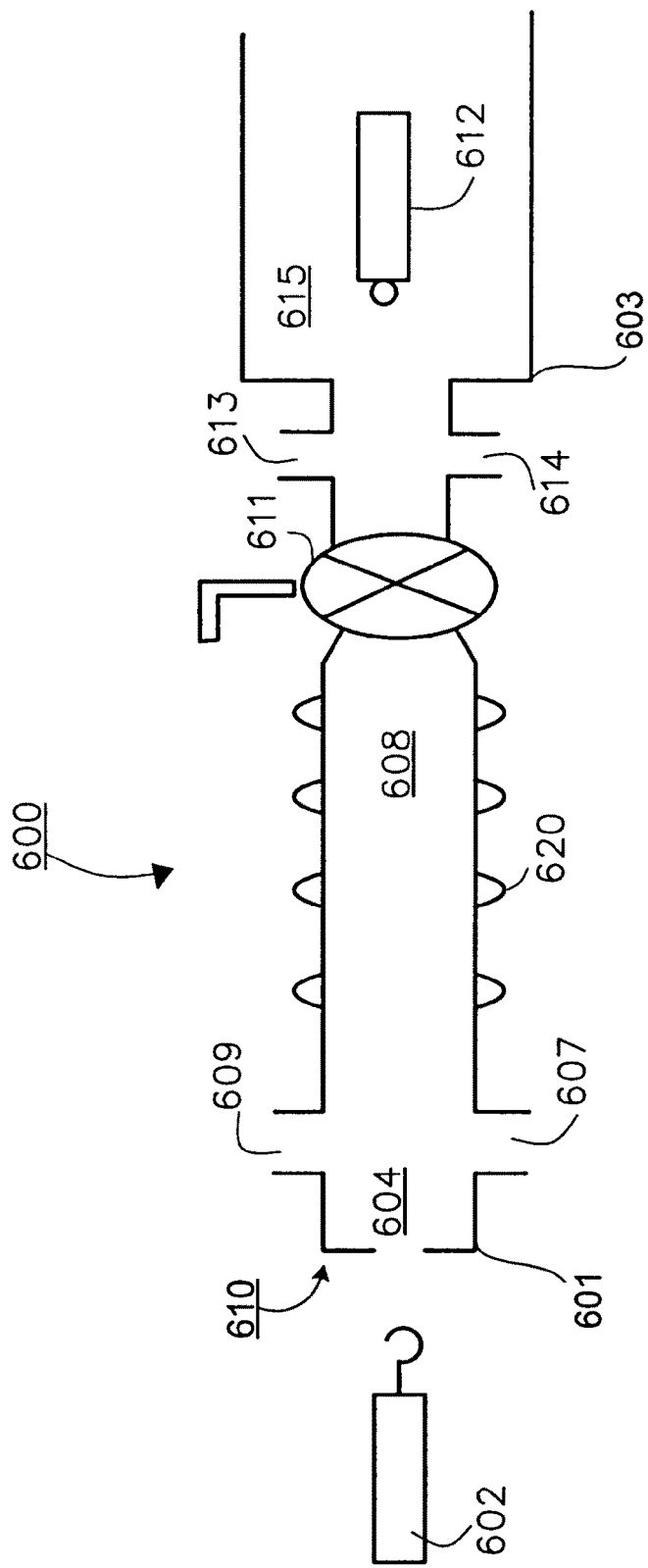
FIG. 6 shows schematically an apparatus for synthesizing nanostructures according to one embodiment of the present invention.

Referring to FIG. 6, an apparatus 600 having a reactor 610 with a reaction zone 608, and means for consecutively introducing batches of a catalyst to the reaction zone 608 is shown according to an alternative embodiment of the present invention, where each batch of the catalyst is positioned in the reaction zone 608 for a period of time for the growth of nanostructures having desired features.

In one embodiment, the reactor 610 includes a first end portion 601 and an opposite, second end portion 603, defining a first entry way and a second entry way, respectively. The reaction zone 608 in one embodiment is located with the confines of the reactor 610 and between the first end portion 601 and the second end portion 603. The reactor 610 further includes a first airlock 604 and a second airlock 615 positioned at the first end portion 601 and the second end portion 603, respectively. The first airlock 604 and a second airlock 615 are used to maintain a constant flow rate for the carrier and hydrocarbon or other feedstock gases inside the reactor area 608 during the insertion or removal of receptacles. The reactor 610 also includes an inlet ball valve 611 positioned between the reaction zone 608 and the second airlock 615 for sealing the airlock 615. The inlet ball valve 611 is used to seal the second airlock 615, which enables the introduction of a new susceptor receptacle into the reactor 610 without upsetting the fluid dynamics inside of the reaction zone 608. Furthermore, the reactor 610 includes a first input port 609 and a first output port 607 that are positioned between the first airlock 604 and the reaction zone 608 for inputting and outputting a carrier gas, respectively. Moreover, the reactor 610 includes a second input port 613 and a second output port 614 that are positioned between the inlet ball valve 611 and the second airlock 615 for inputting and outputting a gas mixture of a carrier gas and a feedstock gas, respectively. Additionally, the reactor 610 includes a heating member 620 formed on the reactor 600 for heating the reaction zone 608. As in other embodiments of the present invention the reaction zone 608 can be heated by way of the inductor coils 620 or conventional thermal heating methods.

In one embodiment, the introducing means has a first set of susceptor receptacles 602 and a second set of susceptor receptacles 612. Each susceptor receptacle 602 or 612 is adapted for containing a batch of a catalyst. In one embodiment, the first set of susceptor receptacles 602 and the second set of susceptor receptacles 612 are consecutively introduced into the reaction zone 608 of the reactor 600 from the first entry way and the second entry way of the reactor 610, respectively. The first entry way and the second entry way are formed at the first end portion 601 and the second end portion 603 of the reactor 610, respectively. Once the introducing process of one of the first set of susceptor receptacle 602 is completed, one of the second set of susceptor receptacle 612 is introduced into the reaction zone 608 of the reactor 610, and vice versa.

FIG. 10 shows a flow chart of a method for synthesizing nanostructures in a reactor 610 having a first entry way and an opposite, second entry way defining a reaction zone 608 therebetween, and a first airlock 604 at a first end of the nanostructure reactor 600 and a second airlock 615 situated at a second end of the nanostructure reactor 600. In the embodiment, the method includes the following steps: at step 1005, the reaction zone 608 of the nanostructure reactor 610 is heated. At step 1010, batches of a catalyst are consecutively introduced into the reaction zone 608 from the first entry way and the second entry way, respectively. In one embodiment, the method further includes the step of regulating exposure time of the catalyst in the reaction zone 608 to facilitate the growth of nanostructures. Aspects of the present embodiment provide steps for maintaining a constant flow rate for a carrier gas and a carbon feedstock inside the nanostructure reactor 600. Further aspects provide for the maintaining of a constant flow rate by the use of at least one of the first air lock 604 and the second airlock 615.

Figure 7:
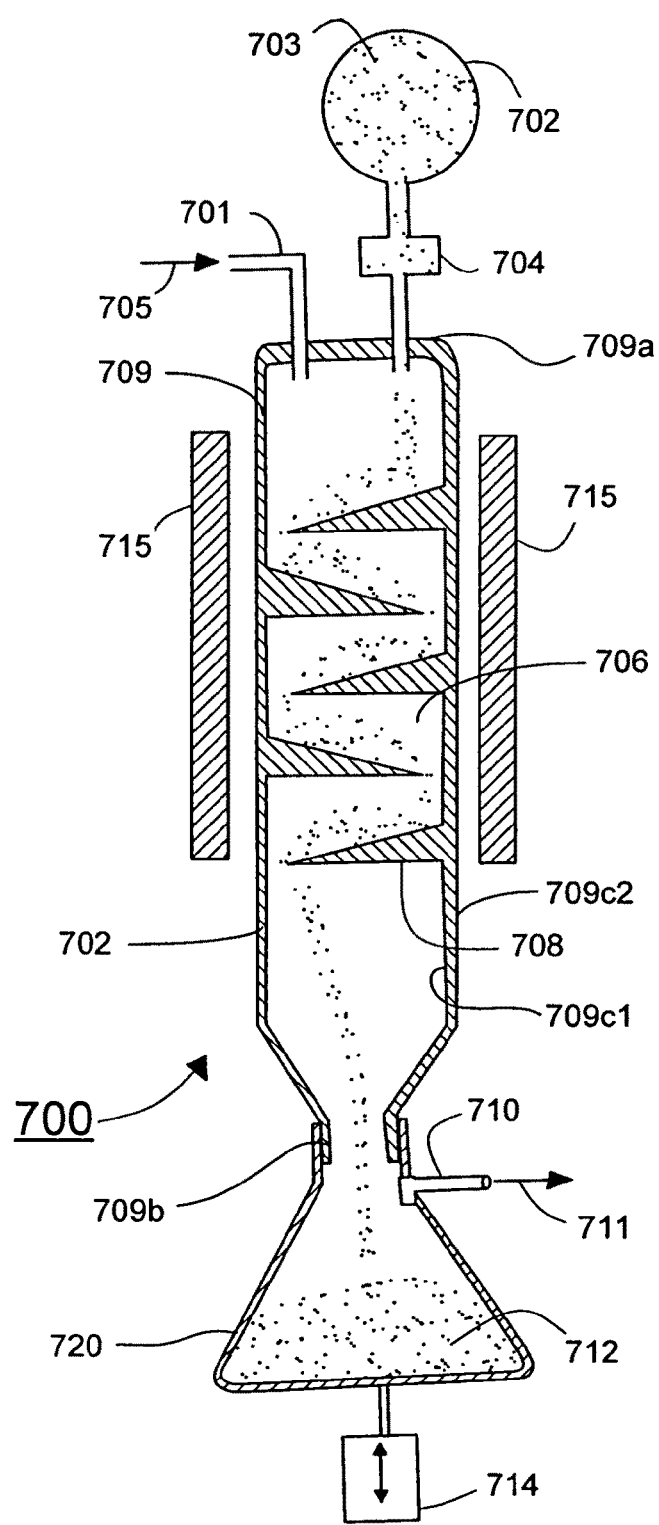
FIG. 7 shows schematically an apparatus for synthesizing nanostructures according to another embodiment of the present invention.

FIG. 7 illustrates another embodiment of the present invention. The apparatus 700 as illustrated in FIG. 7 provides for the consecutive introduction of batches of a catalyst 703 to a reaction zone 706. In the embodiment, the apparatus 700 has a chamber 709 having a first end 709a, an opposite, second end 709b, and a body portion 709c defined therebetween. The body portion 709c has an interior surface 709c1 and an exterior surface 709c2. The apparatus 700 also includes a heating member 715 that is formed on the exterior surface 709c2 of the body portion 709c of the chamber 709, hereby defining a reaction zone 706 inside the chamber 709. Furthermore, the apparatus 700 includes a plurality of baffles 708 protruding inwardly from the interior surface 709c1 of the body portion 709c of the chamber 709 in the reaction zone 706. In one embodiment, the baffles 708 are configured in a staggered descending vertical arrangement, where each consecutive baffle 708 is located on a side that is opposite to that of its predecessor. Each of the baffles 708 further comprises a downward sloping shape for allowing for any material that is deposited upon a baffle 708 to be easily transferred to a lower level baffle 708.

Moreover, the apparatus 700 includes a catalyst tank 702 positioned proximate to the first end 709a of the chamber 709 for introducing batches of a catalyst 703 in a powder form to the reaction zone 706. The catalyst tank 702 contains the catalyst powder 703. The catalyst tank 702 is further equipped with a catalyst feeder 704 that is in communication with the catalyst tank 702, where the catalyst feeder 704 vertically controls the introduction of catalyst powder 703 into the reaction zone 706. Additionally, the apparatus 700 includes an input valve 701 positioned at the first end 709a of the chamber 709 for introducing a mixture 705 containing a feedstock gas and a carrier gas to the reaction zone 706.

In operation, a stream of catalyst powder 703 is introduced into the reaction zone 706, the stream of catalyst powder 703 is deposited upon and sifted between the pluralities of baffles 708 to facilitate the growth of nanostructures. The mixture 705 including hydrocarbon or other types of feedstock and a carrier gas are input to the chamber 709 via an input valve 706. The chamber 709 and the reaction zone 706 are heated by way of an inductor heater 715 or conventional thermal heating methods. The catalyst powder 703 is transferred between baffles 708 with the aid of a vibration inducing mechanism 714 that is in mechanical contact with the apparatus 700. The vibration inducing mechanism vibrates the chamber 709, thus the vibrations along with gravity provides the force that is needed to sift the catalyst powder 703 from one baffle 708 to another baffle 708 through the reaction zone 706.

The apparatus 700 further has a collector 720 in communication with the second end 709b of the chamber 709 for collecting nanostructures 712, and means for outputting an exhaust gas mixture 711 out of the chamber 709. In one embodiment, the outputting means includes an output vale 710 for controlling output of the exhaust gas mixture 711.

A further aspect of the present invention relates to a method for synthesizing nanostructures including the step of consecutively and vertically introducing batches of catalyst to the reaction zone 706. Thereafter, the catalyst is deposited upon and sifted between the pluralities of baffles 708 that are situated within a reaction zone 706. The catalyst is transferred from one baffle to another baffle with the aid of a vibration inducing mechanism that is contact with the reactor 700.

Any of the above-mentioned embodiments alone or in combination will permit the continuous production of nanostructures. Further, any other methods that achieve the same result by controlling the above-mentioned pertinent factors are encompassed within the scope of this invention.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claim.

What is claimed is:

1. A method for synthesizing nanostructures, comprising the steps of:
   a. providing an apparatus, wherein the apparatus comprises:
      (i). a chamber having a first end, an opposite, second end, a body portion defined therebetween and defining a cavity with an axis, a first opening channel interconnecting through the first end in fluid communication with the cavity, and a second opening channel interconnecting through the second end in fluid communication with the cavity;
      (ii). a heating member formed on the exterior surface of the body portion of the chamber for substantially uniformly heating the chamber so as to create a reaction zone in the cavity;
      (iii). a honeycomb-like structure having an axis and positioned in the reaction zone with the axis being substantially coincident with the axis of the cavity of the chamber; and
      (iv). a porous plate having an axis and positioned in the reaction zone and between the honeycomb-like structure and the second end of the chamber with the axis being substantially coincident with the axis of the cavity of the chamber, wherein the porous plate is adapted for receiving and supporting a catalyst;
   b. introducing a gas mixture through the first opening channel into the cavity of the chamber; and
   c. generating nanostructures from the interaction of the gas mixture and the catalyst in the reaction zone,
   wherein the gas mixture after crossing the porous plate causes the catalyst to fluidize such that particles of the catalyst are suspended substantially individually in the gas stream of the gas mixture.

2. The method of claim 1, further comprising the step of preheating the gas mixture before the gas mixture reaches the catalyst.

3. The method of claim 1, further the step of vibrating the apparatus for improving fluidization of the catalyst interacting with the gas mixture.

4. The method of claim 1, wherein the gas mixture comprises at least one of a carrier gas and a feedstock gas.

5. The method of claim 4, wherein the feedstock gas comprises hydrocarbon.

6. The method of claim 4, further comprising the step of outputting an exhaust gas mixture out of the cavity from the second opening channel of the chamber.

7. The method of claim 6, wherein the exhaust gas mixture comprises at least one of a carrier gas and an un-reacted feedstock gas.

8. A method for synthesizing nanostructures, comprising the steps of:
   a. providing an apparatus, wherein the apparatus comprises:
      (i). a chamber having a first end, an opposite, second end, and a body portion defined therebetween and defining a cavity with an axis;
      (ii). a heating member formed on the exterior surface of the chamber for heating the chamber so as to create a reaction zone in the cavity;
      (iii). a porous plate having an axis and positioned in the reaction zone with the axis being substantially coincident with the axis of the cavity of the chamber; and
      (iv). a susceptor having a body portion defining a recess therein, placed in the reaction zone and supported by the porous plate, the recess being at least partially filled with a catalyst;
   b. introducing a gas mixture through the first opening channel into the cavity of the chamber; and
   c. generating nanostructures from the interaction of the gas mixture and the catalyst in the reaction zone.

9. The method of claim 8, further comprising the step of collecting the generated nanostructures through the second end of the chamber when they are filled in and overflown from the susceptor.

10. The method of claim 8, further comprising the step of vibrating the apparatus for improving fluidization of the catalyst interacting with the gas mixture.

11. The method of claim 8, wherein the gas mixture comprises at least one of a carrier gas and a feedstock gas.

12. The method of claim 11, wherein the feedstock gas comprises hydrocarbon.

* * * * *

UNITED STATES PATENT AND TRADEMARK OFFICE
CERTIFICATE OF CORRECTION

PATENT NO. : 8,017,892 B2
APPLICATION NO. : 12/217978
DATED : September 13, 2011
INVENTOR(S) : Biris et al.

It is certified that error appears in the above-identified patent and that said Letters Patent is hereby corrected as shown below:

On the Title Page of the Letters Patent Item (73):

Please delete the name of the Assignee:

"Board of Turstees of the University of Arkansas, Little Rock, AK (US)".

Please add the name of the Assignee:

--Board of Trustees of the University of Arkansas, Little Rock, AR (US)--.

Signed and Sealed this
Twenty-ninth Day of November, 2011

David J. Kappos
*Director of the United States Patent and Trademark Office*